United States Patent
Shimojo

(10) Patent No.: US 10,943,914 B2
(45) Date of Patent: Mar. 9, 2021

(54) SEMICONDUCTOR MEMORY DEVICE INCLUDING A SUBSTRATE, VARIOUS INTERCONNECTIONS, SEMICONDUCTOR MEMBER, CHARGE STORAGE MEMBER AND A CONDUCTIVE MEMBER

(71) Applicant: TOSHIBA MEMORY CORPORATION, Minato-ku (JP)

(72) Inventor: Yoshiro Shimojo, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/931,961

(22) Filed: May 14, 2020

(65) Prior Publication Data

US 2020/0273869 A1 Aug. 27, 2020

Related U.S. Application Data

(63) Continuation of application No. 15/929,080, filed on Jan. 2, 2019, now Pat. No. 10,672,779, which is a
(Continued)

(30) Foreign Application Priority Data

Mar. 10, 2016 (JP) .................. 2016-047644

(51) Int. Cl.
| | | |
|---|---|---|
| *H01L 27/11* | (2006.01) | |
| *H01L 27/11548* | (2017.01) | |
| *H01L 27/11519* | (2017.01) | |
| *H01L 27/11526* | (2017.01) | |
| *H01L 27/11556* | (2017.01) | |
| *H01L 27/11565* | (2017.01) | |
| *H01L 27/11573* | (2017.01) | |

(Continued)

(52) U.S. Cl.
CPC .. *H01L 27/11548* (2013.01); *H01L 27/11519* (2013.01); *H01L 27/11526* (2013.01); *H01L 27/11556* (2013.01); *H01L 27/11565* (2013.01); *H01L 27/11573* (2013.01); *H01L 27/11575* (2013.01); *H01L 27/11582* (2013.01)

(58) Field of Classification Search
CPC ................................................ H01L 27/11548
See application file for complete search history.

(56) References Cited

U.S. PATENT DOCUMENTS 8,008,710 B2 8/2011 Fukuzumi
8,084,809 B2 12/2011 Maeda et al.
(Continued)

FOREIGN PATENT DOCUMENTS

JP 2007-266143 10/2007
JP 2015-149413 8/2015

*Primary Examiner* — William Coleman
(74) *Attorney, Agent, or Firm* — Oblon, McClelland, Maier & Neustadt, L.L.P.

(57) ABSTRACT

According to one embodiment, a semiconductor memory device includes: a substrate; a first interconnect; a second interconnect; a plurality of third interconnects; a fourth interconnect; a semiconductor member; a charge storage member; and a conductive member. One of the plurality of third interconnects is disposed on two second-direction sides of the conductive member. Portions of the one of the plurality of third interconnects disposed on the two second-direction sides of the conductive member are formed as one body.

24 Claims, 12 Drawing Sheets

Related U.S. Application Data continuation of application No. 15/934,437, filed on Mar. 23, 2018, now Pat. No. 10,217,757, which is a continuation of application No. 15/455,443, filed on Mar. 10, 2017, now Pat. No. 9,960,173.

(51) Int. Cl.
*H01L 27/11575* (2017.01)
*H01L 27/11582* (2017.01)

(56) References Cited

U.S. PATENT DOCUMENTS

| | | |
|---|---|---|
| 8,547,720 B2 | 10/2013 | Samachisa et al. |
| 9,391,090 B2 | 7/2016 | Manorotkul |
| 9,515,087 B2 | 12/2016 | Son |
| 9,716,062 B2 | 7/2017 | Yada |
| 9,960,173 B2 | 5/2018 | Shimojo |
| 10,217,757 B2 * | 2/2019 | Shimojo ............ H01L 27/11519 |
| 2007/0252201 A1 | 11/2007 | Kito et al. |
| 2009/0267128 A1 | 10/2009 | Maejima |
| 2011/0220987 A1 | 9/2011 | Tanaka et al. |
| 2014/0284674 A1 | 9/2014 | Iwai |
| 2015/0129878 A1 | 5/2015 | Shin et al. |
| 2015/0221667 A1 | 8/2015 | Fukuzumi et al. |

\* cited by examiner

US 10,943,914 B2

SEMICONDUCTOR MEMORY DEVICE INCLUDING A SUBSTRATE, VARIOUS INTERCONNECTIONS, SEMICONDUCTOR MEMBER, CHARGE STORAGE MEMBER AND A CONDUCTIVE MEMBER

CROSS-REFERENCE TO RELATED APPLICATIONS

This application is a continuation of U.S. application Ser. No. 15/929,080, filed Jan. 2, 2019, which is a continuation of U.S. application Ser. No. 15/934,437, filed Mar. 23, 2018, which is a continuation of U.S. application Ser. No. 15/455,443, filed Mar. 10, 2017, which is based upon and claims the benefit of priority from Japanese Patent Application No. 2016-047644, filed on Mar. 10, 2016; the entire contents of each of which are incorporated herein by reference.

FIELD

Embodiments described herein relate generally to a semiconductor memory device.

BACKGROUND

In recent years, a stacked semiconductor memory device has been proposed in which memory cells are integrated three-dimensionally. In such a stacked semiconductor memory device, a stacked body in which electrode films and insulating films are stacked alternately on a semiconductor substrate is provided; and semiconductor pillars that pierce the stacked body are provided. Then, memory cells are formed at each crossing portion of the electrode films and the semiconductor pillars. To realize even higher integration in such a stacked semiconductor memory device, it may be considered to dispose, between the semiconductor substrate and the stacked body, a portion of a control circuit controlling the memory cells.

DETAILED DESCRIPTION

In general, according to one embodiment, a semiconductor memory device includes a substrate, a first interconnect provided on one side of the substrate in a first direction, a second interconnect provided on the one side of the first interconnect, a plurality of third interconnects extending in a second direction, being arranged to be separated from each other along the first direction, and being provided on the one side of the second interconnect, the second direction crossing the first direction, a fourth interconnect provided on the one side of the third interconnects; a semiconductor member extending in the first direction and piercing the plurality of third interconnects, one end portion of the semiconductor member being connected to the second interconnect, a charge storage member provided between the semiconductor member and one of the plurality of third interconnects, and a conductive member connected between the first interconnect and the fourth interconnect and insulated from the second interconnect and the plurality of third interconnects. One of the plurality of third interconnects is disposed on two second-direction sides of the conductive member. Portions of the one of the plurality of third interconnects disposed on the two second-direction sides of the conductive member are formed as one body.

First Embodiment

Embodiments of the invention will now be described with reference to the drawings.

First, a first embodiment will be described.

Figure 1:
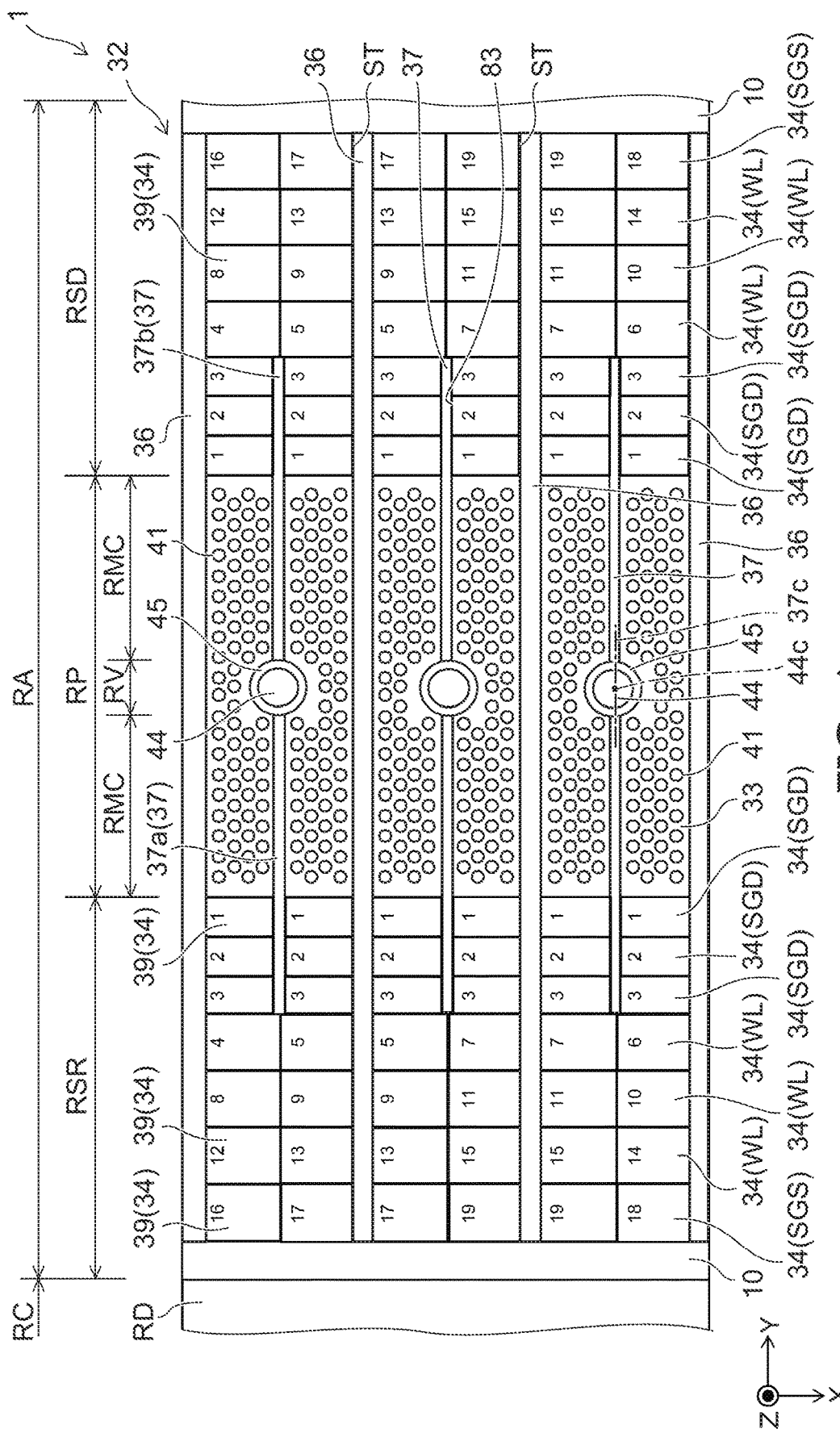
FIG. 1 is a plan view showing a semiconductor memory device according to a first embodiment.

FIG. 1 is a plan view showing a semiconductor memory device according to the embodiment.

Figure 2:
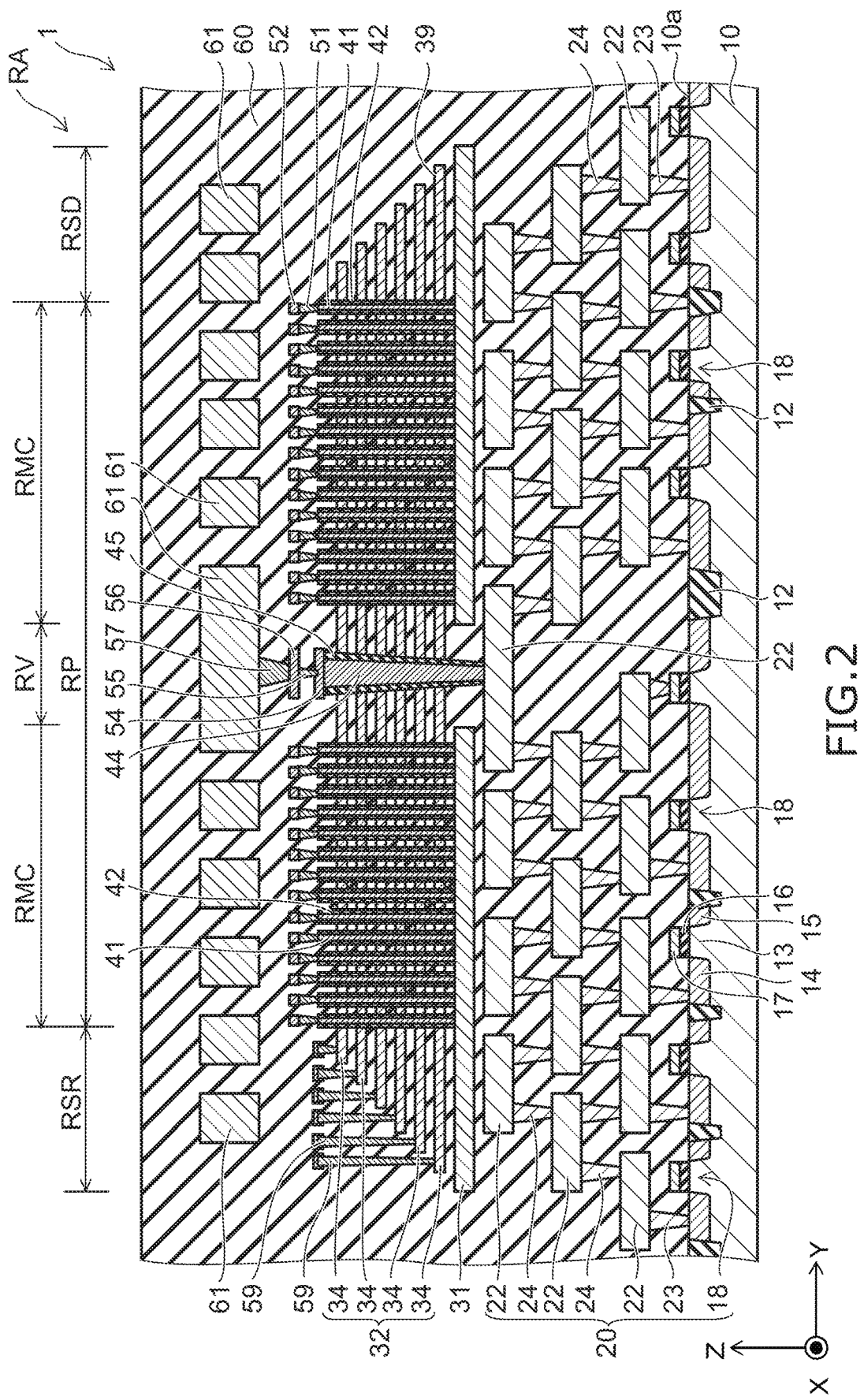
FIG. 2 is a cross-sectional view showing the semiconductor memory device according to the first embodiment.

FIG. 2 is a cross-sectional view showing the semiconductor memory device according to the embodiment.

Figure 3A:
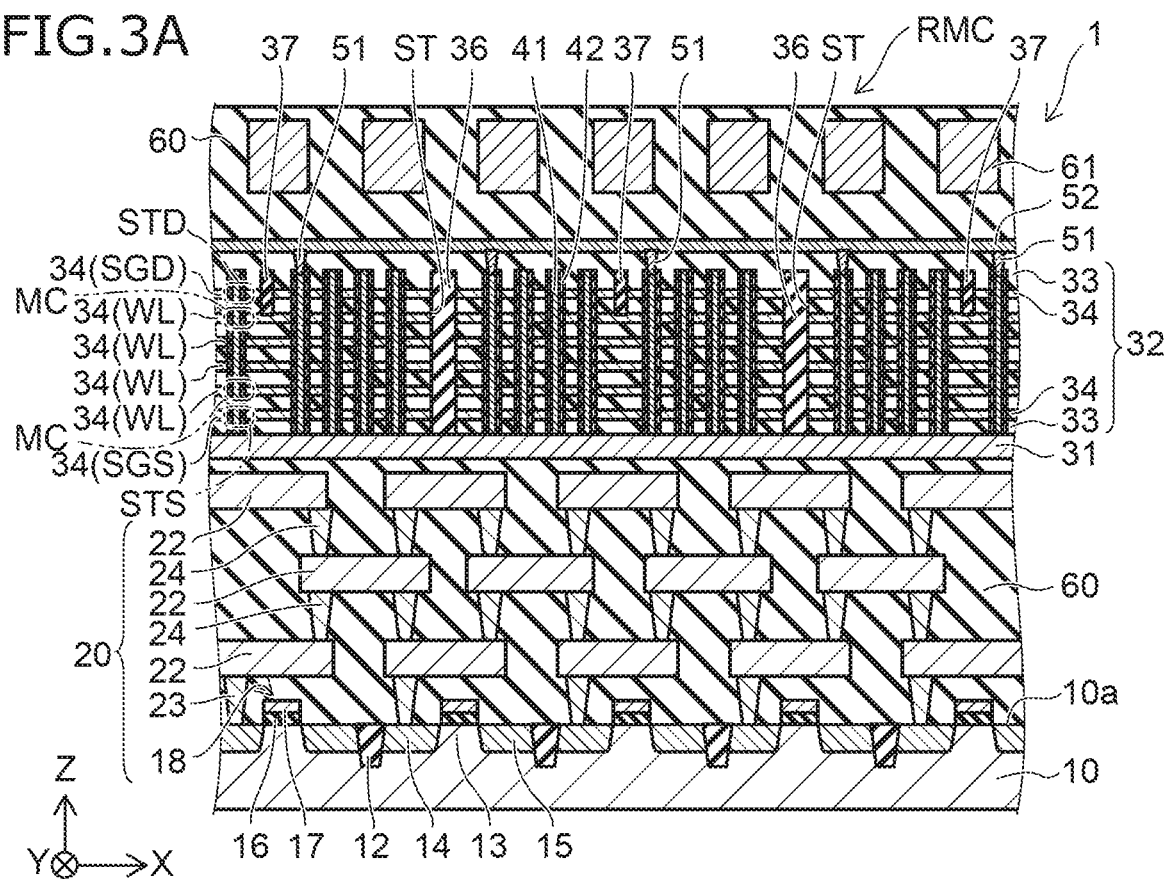
FIGS. 3A and 3B are cross-sectional views showing the semiconductor memory device according to the first embodiment.
Figure 3B:
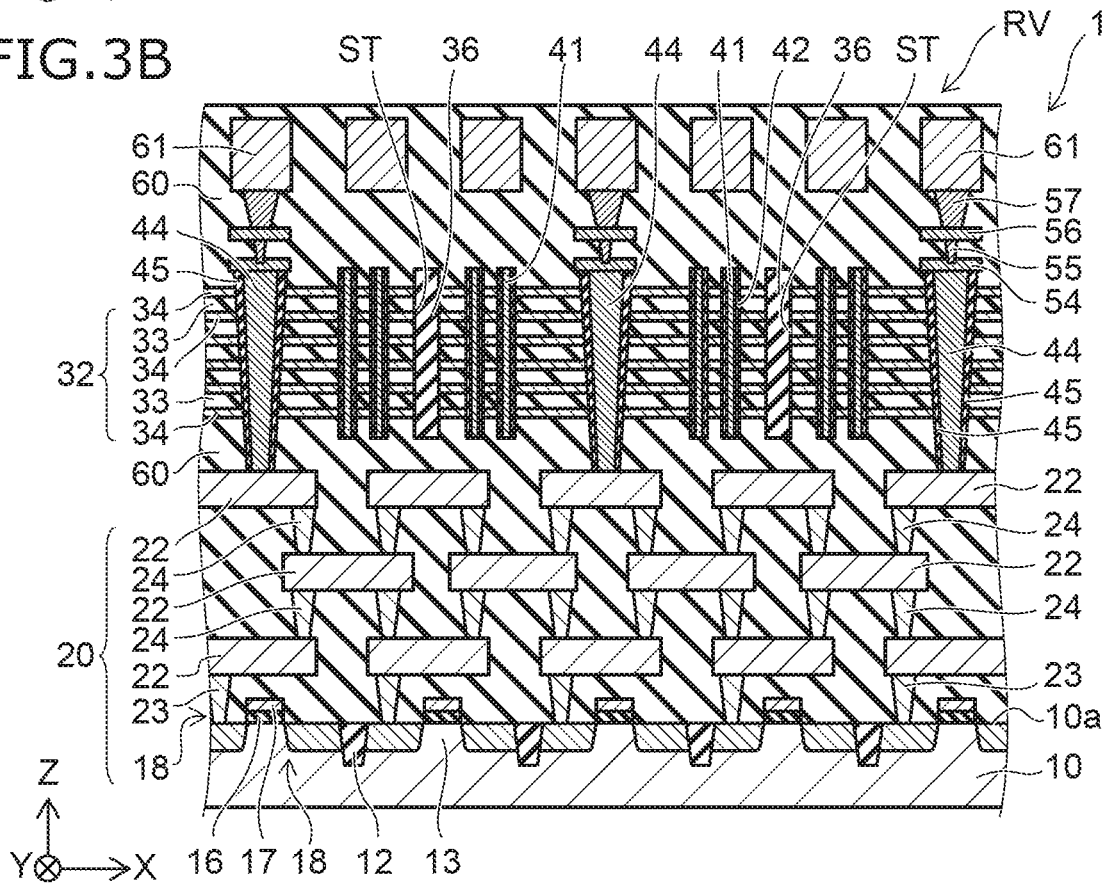

FIGS. 3A and 3B are cross-sectional views showing the semiconductor memory device according to the embodiment.

Figure 4:
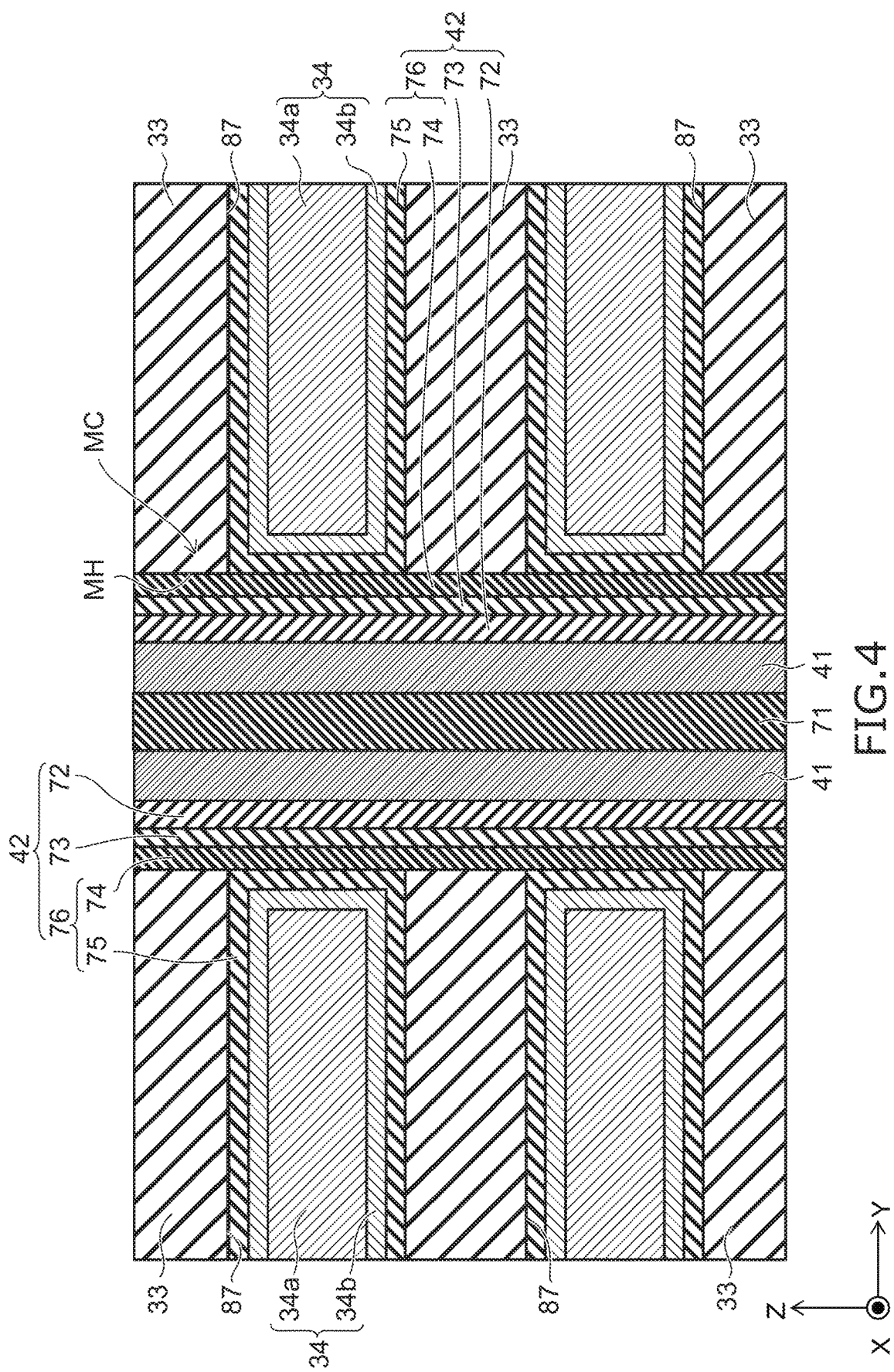
FIG. 4 is a partially-enlarged cross-sectional view showing memory cells of the semiconductor memory device according to the first embodiment.

FIG. 4 is a partially-enlarged cross-sectional view showing memory cells of the semiconductor memory device according to the embodiment.

FIG. 2 shows a YZ cross section parallel to word lines WL described below; and FIGS. 3A and 3B show an XZ cross section parallel to bit lines 52 described below. FIG. 3A shows a memory cell region RMC; and FIG. 3B shows a through-via region RV. The drawings are schematic; and, for example, the numbers and dimensional ratios of the components do not always match between the drawings.

As shown in FIG. 1, FIG. 2, and FIGS. 3A and 3B, a semiconductor substrate 10 made of, for example, silicon is provided in the semiconductor memory device 1 according to the embodiment.

In the specification hereinbelow, an XYZ orthogonal coordinate system is employed for convenience of description. Two mutually-orthogonal directions parallel to an upper surface 10a of the semiconductor substrate 10 are taken as an "X-direction" and a "Y-direction;" and a direction perpendicular to the upper surface 10a, i.e., the vertical direction, is taken as a "Z-direction." In the specification, although the direction in the Z-direction in which the upper surface 10a faces also is called "up" and the reverse direction also is called "down," this differentiation is for convenience and is independent of the direction of gravity.

In the upper surface 10a of the semiconductor substrate 10, a memory array region RA is set; and a peripheral circuit region RC is set around the memory array region RA. A row decoder RD is formed in a region of the peripheral circuit region RC positioned on one Y-direction side of the memory array region RA. The row decoder RD is a portion of a control circuit controlling the memory cells described below.

In the memory array region RA, a STI (Shallow Trench Isolation (element-separating insulating film)) 12 is selectively provided in the upper layer portion of the semiconductor substrate 10. The upper layer portion of the semiconductor substrate 10 is partitioned into multiple semiconductor regions 13 by the STI 12. A source layer 14 and a drain layer 15 are formed inside at least a portion of the semiconductor regions 13. A gate insulating film 16 and a gate electrode 17 are provided on the semiconductor substrate 10 in a region directly above a region between the source layer 14 and the drain layer 15. Thereby, multiple field effect transistors 18 are formed in the upper surface 10a of the semiconductor substrate 10.

An inter-layer insulating film 60 that is made of, for example, silicon oxide (SiO) is provided on the semiconductor substrate 10. For example, multiple layers, e.g., three layers, of interconnects 22 are provided inside the inter-layer insulating film 60. A contact 23 is connected between the semiconductor substrate 10 and the interconnect 22 of the lowermost layer. A via 24 is connected between the interconnects 22 separated in the Z-direction. An integrated circuit 20 is formed of the transistors 18, the interconnects 22, the contacts 23, and the vias 24. The integrated circuit 20 is another portion of the control circuit described above and is, for example, a sense amplifier. The arrangements, sizes, and connectional relationships of the transistors 18, the interconnects 22, the contacts 23, and the vias 24 shown in FIG. 2 and FIGS. 3A and 3B are schematic.

A buried source line 31 is provided on the interconnect 22 of the uppermost layer. The buried source line 31 is, for example, a two-layer film including a lower layer portion made of tungsten (W) and an upper layer portion made of silicon (Si). The buried source line 31 is divided into multiple portions in the Y-direction, is disposed in the memory cell region RMC, and is not disposed in the through-via region RV. A potential is supplied to each portion of the buried source line 31 from the integrated circuit 20. If the buried source line 31 has a hole through which a through-via 44 described below can pass, the buried source line 31 may not be divided into the multiple portions in the Y-direction.

A stacked body 32 is provided on the buried source line 31. For example, an insulating film 33 that is made of silicon oxide and an electrode film 34 that is made of a conductive material are stacked alternately along the Z-direction in the stacked body 32.

Multiple insulating plates 36 are provided inside the stacked body 32. For example, the insulating plates 36 are made from silicon oxide; and the lower ends of the insulating plates 36 contact the buried source line 31. The configurations of the insulating plates 36 are plate configurations spreading along the YZ plane. The stacked body 32 is divided into multiple portions in the X-direction by the insulating plates 36; and the configuration of each of the electrode films 34 is an interconnect configuration extending in the Y-direction.

An insulating member 37 that extends in the Y-direction is provided between the insulating plates 36 adjacent to each other in the X-direction. For example, the insulating member 37 is positioned at the center between the insulating plates 36 adjacent to each other in the X-direction. The insulating member 37 is disposed inside the upper portion of the stacked body 32 and divides, into two along the X-direction, the electrode films 34 of one or more layers from the top. The divided electrode films 34 function as upper selection gate lines SGD. FIG. 1 shows an example in which the insulating members 37 divide the electrode films 34 of three layers from the top. FIGS. 3A and 3B show an example in which the insulating members 37 divide the electrode film 34 of one layer from the top.

A real staircase region RSR, a pillar placement region RP, and a dummy staircase region RSD are provided in the memory array region RA and are arranged in this order along the Y-direction. In other words, the real staircase region RSR and the dummy staircase region RSD are disposed on the two Y-direction sides of the pillar placement region RP. As described below, the stacked body 32 is patterned into a staircase configuration in the real staircase region RSR and in the dummy staircase region RSD.

In the pillar placement region RP, silicon pillars 41 that extend in the Z-direction are provided inside the stacked body 32. The silicon pillar 41 is made of polysilicon; and the configuration of the silicon pillar 41 is a circular tube having a plugged lower end portion. The lower end of the silicon pillar 41 is connected to the buried source line 31; and the upper end of the silicon pillar 41 reaches the upper surface of the stacked body 32. A memory film 42 is provided on the side surface of the silicon pillar 41.

The memory cell region RMC, the through-via region RV, and the memory cell region RMC are provided in the pillar placement region RP and are arranged in this order along the Y-direction. In other words, the through-via region RV is disposed between the memory cell regions RMC of two locations separated in the Y-direction.

In the memory cell region RMC, when viewed from the Z-direction, the silicon pillars 41 are arranged periodically along multiple columns, e.g., four columns, between the insulating plate 36 and the insulating member 37. Each column extends in the Y-direction; and the positions of the silicon pillars 41 are shifted one-half period in the Y-direction between the mutually-adjacent columns. On each of the silicon pillars 41, a plug 51 is provided; and the bit line 52 that extends in the X-direction is provided on the plug 51. Thereby, the silicon pillar 41 is connected to the bit line 52 via the plug 51. In FIG. 1, the components that are disposed higher than the stacked body 32 are not illustrated.

In the through-via region RV, the through-via 44 that extends in the Z-direction and pierces the stacked body 32 is provided. In the through-via 44, for example, a barrier metal layer that is made of titanium nitride is formed on the side surface and lower surface of a main portion made of tungsten. The upper end of the through-via 44 reaches the upper surface of the stacked body 32; and the lower end of the through-via 44 is connected to the interconnect 22 of the uppermost layer of the integrated circuit 20. For example, the through-via 44 is disposed at the Y-direction central portion of the pillar placement region RP.

For example, an insulating film 45 that is made of silicon oxide is provided on the side surface of the through-via 44. The through-via 44 is insulated from the electrode films 34 by the insulating film 45. The thickness of the insulating film 45 is set to a thickness such that the necessary breakdown voltage between the electrode film 34 and the through-via 44 can be realized. The through-via 44 passes between the portions of the buried source line 31, and is separated and insulated from the buried source line 31.

The through-via 44 is disposed to divide the insulating member 37. In other words, the insulating members 37 are provided respectively on the two Y-direction sides of the through-via 44; and the through-via 44 is disposed between these insulating members 37. More specifically, each of the insulating members 37 is divided by the through-via 44 and the insulating film 45 into a portion 37a on the real staircase region RSR side and a portion 37b on the dummy staircase region RSD side; and the through-via 44 is disposed between the portion 37a and the portion 37b. Accordingly, the through-via 44 is disposed between the two electrode films 34 of the uppermost level divided in the X-direction by the insulating members 37. For example, a central axis 44c of the through-via 44 extending in the Z-direction passes through the region between the insulating members 37; and a central axis 37c of the insulating members 37 extending in the Y-direction passes through the through-via 44. When viewed from the Z-direction, the through-via 44 pierces the electrode film 34 but does not divide the electrode film 34. Therefore, all of the electrode films 34 are disposed on the two Y-direction sides of the through-via 44. Also, the portions of each of the electrode films 34 disposed on the two Y-direction sides of the through-via 44 are formed integrally as one electrode film.

An intermediate interconnect 54, a plug 55, an intermediate interconnect 56, and a plug 57 are provided above the through-via 44. The position of the intermediate interconnect 56 in the Z-direction is the same as the position of the bit lines 52. An upper layer interconnect 61 is provided on the plug 57 over the entire region of the semiconductor memory device 1. The through-via 44 is connected to one upper layer interconnect 61 via the intermediate interconnect 54, the plug 55, the intermediate interconnect 56, and the plug 57. Accordingly, one upper layer interconnect 61 is connected to the interconnect 22 of the integrated circuit 20 via the through-via 44. The interconnect 22 is connected to the source layer 14, the drain layer 15, or the gate electrode 17 of the transistor 18. Thus, a power supply potential or a signal potential is applied to the integrated circuit 20 via the upper layer interconnect 61 and the through-via 44.

Although the silicon pillars 41 may be provided in the through-via region RV as well, the silicon pillars 41 are not provided in the region where the through-via 44 and the insulating film 45 are provided or in the periphery of the region where the through-via 44 and the insulating film 45 are provided. Therefore, the number of columns of the silicon pillars 41 in the through-via region RV is less than the number of columns of the silicon pillars 41 in the memory cell region RMC. Also, the plugs 51 and the bit lines 52 are not provided above the silicon pillars 41 provided in the through-via region RV.

In the dummy staircase region RSD and the real staircase region RSR of the memory array region RA, the configuration of the stacked body 32 is a staircase configuration in which a step 39 is formed every electrode film 34. The numerals of each step 39 in FIG. 1 show the order counted from the top of the electrode film 34 forming the step 39. In the real staircase region RSR, a contact 59 is provided in the region directly above each step 39 and is connected to the electrode film 34 forming each step 39. The electrode films 34 are connected to the row decoder RD via the contacts 59 provided in the real staircase region RSR. On the other hand, in the dummy staircase region RSD, contacts that are connected to each of the electrode films 34 are not provided.

The buried source line 31, the stacked body 32, the plugs 51, the bit lines 52, the intermediate interconnect 54, the plug 55, the intermediate interconnect 56, the plug 57, the contacts 59, and the upper layer interconnect 61 are buried inside the inter-layer insulating film 60.

As shown in FIG. 4, for example, a core member 71 that is made of silicon oxide is provided inside the circular tubular silicon pillar 41. The silicon pillar 41 may be a circular column; and the core member 71 may not be provided. A tunneling insulating film 72 is provided on the side surface of the silicon pillar 41. The configuration of the tunneling insulating film 72 is a circular tube. Although the tunneling insulating film 72 normally is insulative, the tunneling insulating film 72 is a film in which a tunneling current is caused to flow when a prescribed voltage within the range of the drive voltage of the semiconductor memory device 1 is applied; and the tunneling insulating film 72 is formed of, for example, silicon oxide.

A charge storage film 73 is provided on the side surface of the tunneling insulating film 72. The configuration of the charge storage film 73 is a circular tube. The charge storage film 73 is a film that can store a charge and is formed of, for example, silicon nitride. The charge storage film 73 may be formed of a conductive material such as polysilicon, etc. In such a case, the charge storage film 73 is divided every electrode film 34 in the Z-direction. A low dielectric constant layer 74 is provided on the side surface of the charge storage film 73. The low dielectric constant layer 74 is formed of, for example, silicon oxide.

On the other hand, a high dielectric constant layer 75 is provided on the upper surface of the electrode film 34, on the lower surface of the electrode film 34, and on the side surface of the electrode film 34 facing the silicon pillar 41. The high dielectric constant layer 75 is formed of a material having a relative dielectric constant that is higher than the relative dielectric constant of silicon oxide and is formed of, for example, aluminum oxide (AlO). A blocking insulating film 76 is formed of the low dielectric constant layer 74 and the high dielectric constant layer 75. The blocking insulating film 76 is a film in which a current substantially does not flow even when a voltage within the range of the drive voltage of the semiconductor memory device 1 is applied. The memory film 42 is formed of the tunneling insulating film 72, the charge storage film 73, and the blocking insulating film 76.

A main portion 34a that is made of, for example, tungsten and a barrier metal layer 34b that is made of, for example, titanium nitride (TiN) are provided in the electrode film 34. The barrier metal layer 34b is provided on the upper surface of the main portion 34a, on the lower surface of the main portion 34a, and on the side surface of the main portion 34a facing the silicon pillar 41.

In the memory cell region RMC, the silicon pillars 41 are connected between the buried source line 31 and the bit lines 52. The electrode film 34 of one or multiple levels from the top of the stacked body 32, i.e., the electrode film 34 that is divided into a line-and-space configuration by the insulating plates 36 and the insulating members 37, functions as the upper selection gate line SGD; and an upper selection gate transistor STD is configured at each crossing portion between the upper selection gate line SGD and the silicon pillars 41.

For the electrode films 34 that are divided by the insulating plates 36 but not divided by the insulating members 37, the electrode film 34 of one or multiple levels from the bottom functions as a lower selection gate line SGS; and a lower selection gate transistor STS is configured at each crossing portion between the lower selection gate line SGS and the silicon pillars 41. The electrode films 34 other than the lower selection gate line SGS and the upper selection gate line SGD function as the word lines WL; and a memory cell MC is configured at each crossing portion between the word lines WL and the silicon pillars 41.

Thereby, a NAND string is formed by the multiple memory cells MC being connected in series along each of the silicon pillars 41 and by the lower selection gate transistor STS and the upper selection gate transistor STD being connected to the two ends the silicon pillar 41. On the other hand, NAND strings are not formed for the silicon pillars 41 provided in the through-via region RV because the silicon pillars 41 are not connected to the bit lines 52.

A method for manufacturing the semiconductor memory device according to the embodiment will now be described.

FIGS. 5A and 5B to FIGS. 10A and 10B are cross-sectional views showing the method for manufacturing the semiconductor memory device according to the embodiment.

Figures 5A, 5B:
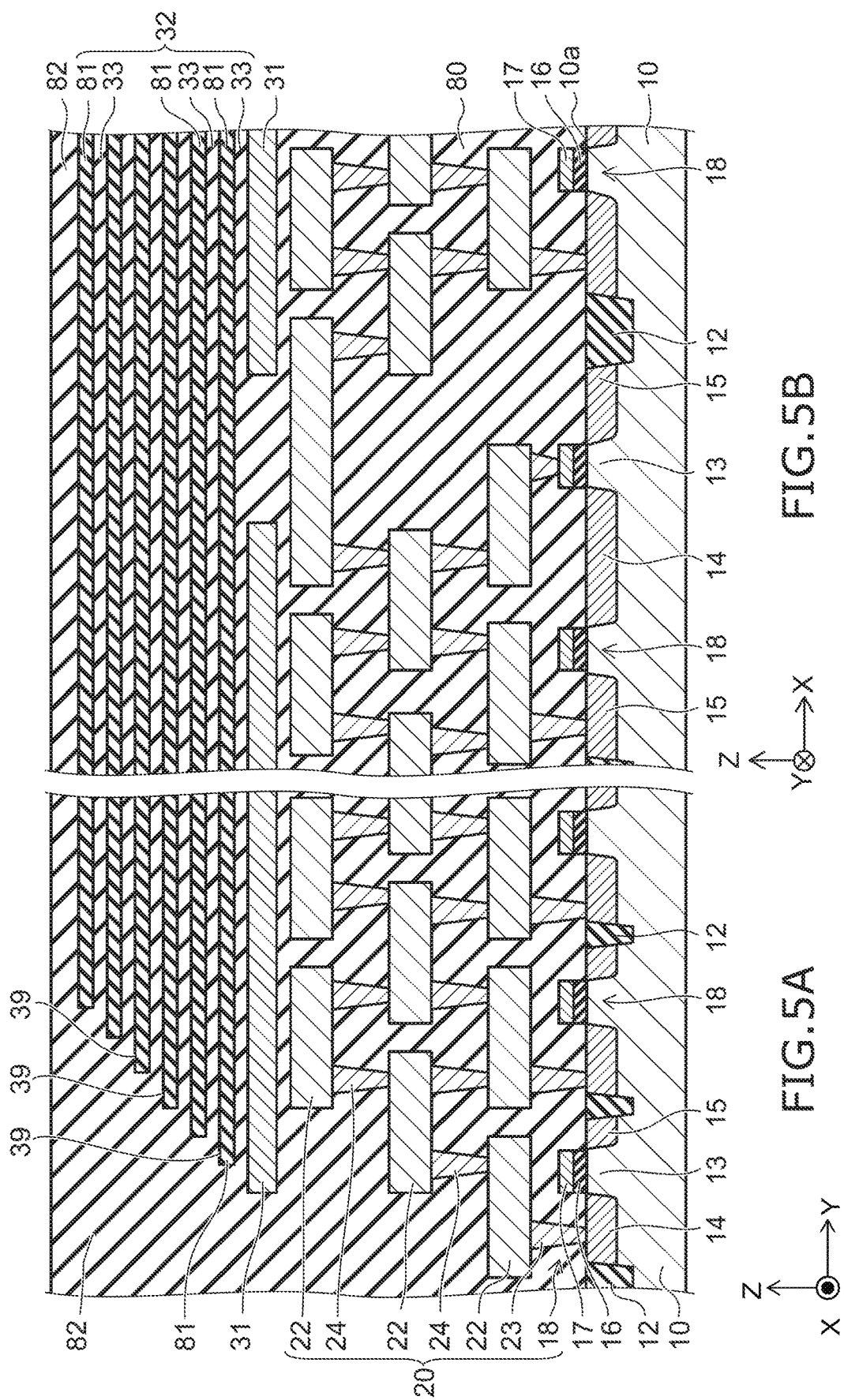
FIGS. 5A and 5B are cross-sectional views showing a method for manufacturing the semiconductor memory device according to the first embodiment.

First, by normal methods as shown in FIGS. 5A and 5B, the transistors 18 are formed in the surface of the semiconductor substrate 10; and the contacts 23, the interconnects 22, the vias 24, etc., are formed on the semiconductor substrate 10 and buried in an inter-layer insulating film 80. Thereby, the integrated circuit 20 is formed. Then, for example, the buried source line 31 is formed on the inter-layer insulating film 80 by stacking a lower layer portion made of tungsten and an upper layer portion made of amorphous silicon.

Continuing, the stacked body 32 is formed by alternately stacking the insulating film 33 made of, for example, silicon oxide (SiO) and a sacrificial film 81 made of, for example, silicon nitride (SiN). Then, the step 39 is formed every sacrificial film 81 by patterning the two Y-direction end portions of the stacked body 32 into staircase configurations. Then, an inter-layer insulating film 82 is formed to bury the stacked body 32; and the upper surface is planarized.

Figures 6A, 6B:
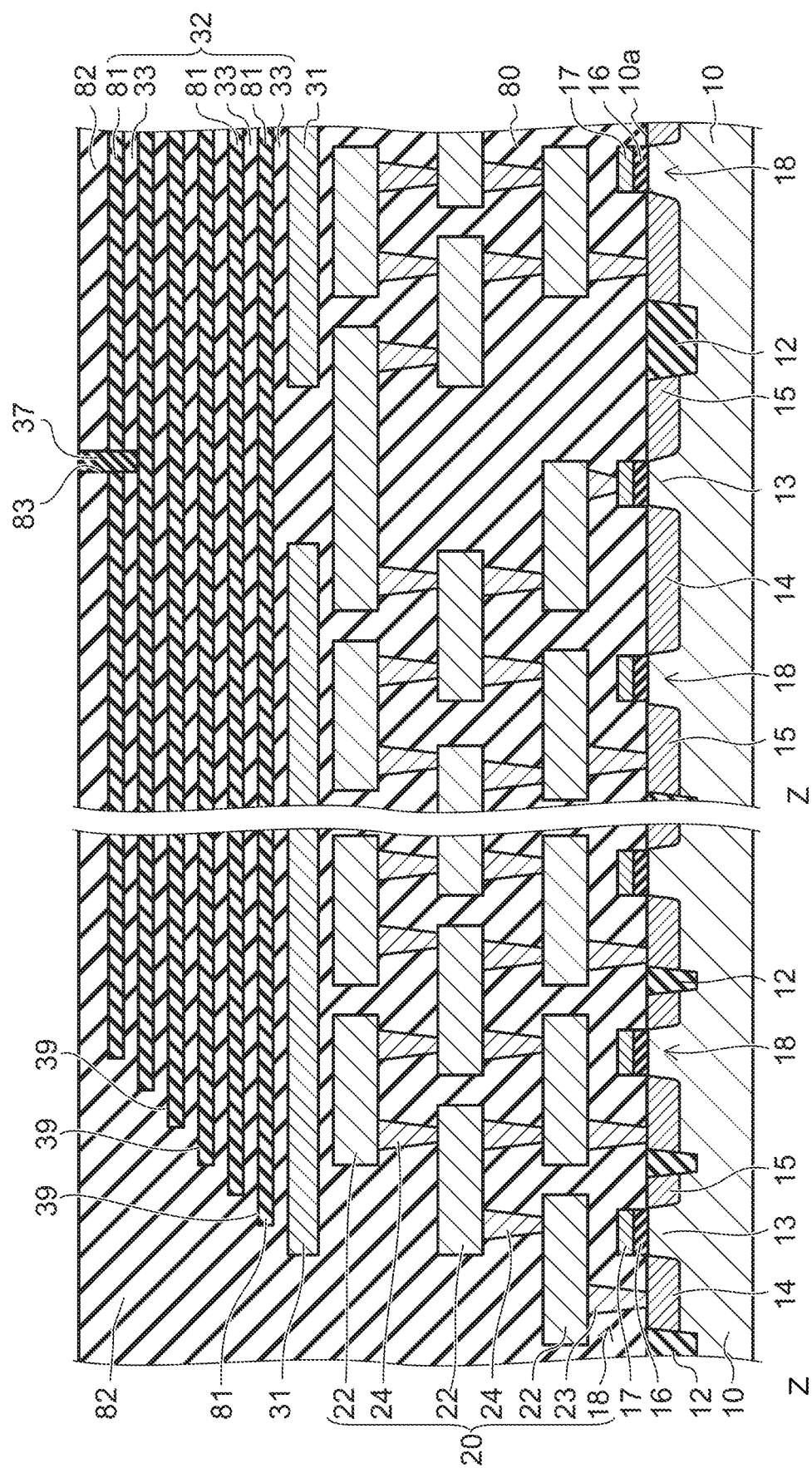
FIGS. 6A and 6B are cross-sectional views showing the method for manufacturing the semiconductor memory device according to the first embodiment.

Then, as shown in FIGS. 6A and 6B, a trench 83 that extends in the Y-direction is formed by selectively removing the inter-layer insulating film 82, the sacrificial film 81 of one or multiple layers from the top, and the insulating film 33 of one or multiple layers from the top. Then, the insulating member 37 is formed by filling, for example, silicon oxide into the trench 83. The insulating member 37 divides the sacrificial film 81 of one or multiple layers from the top. An example in which the sacrificial film 81 of the uppermost layer is divided is shown in FIG. 6B.

Figures 7A, 7B:
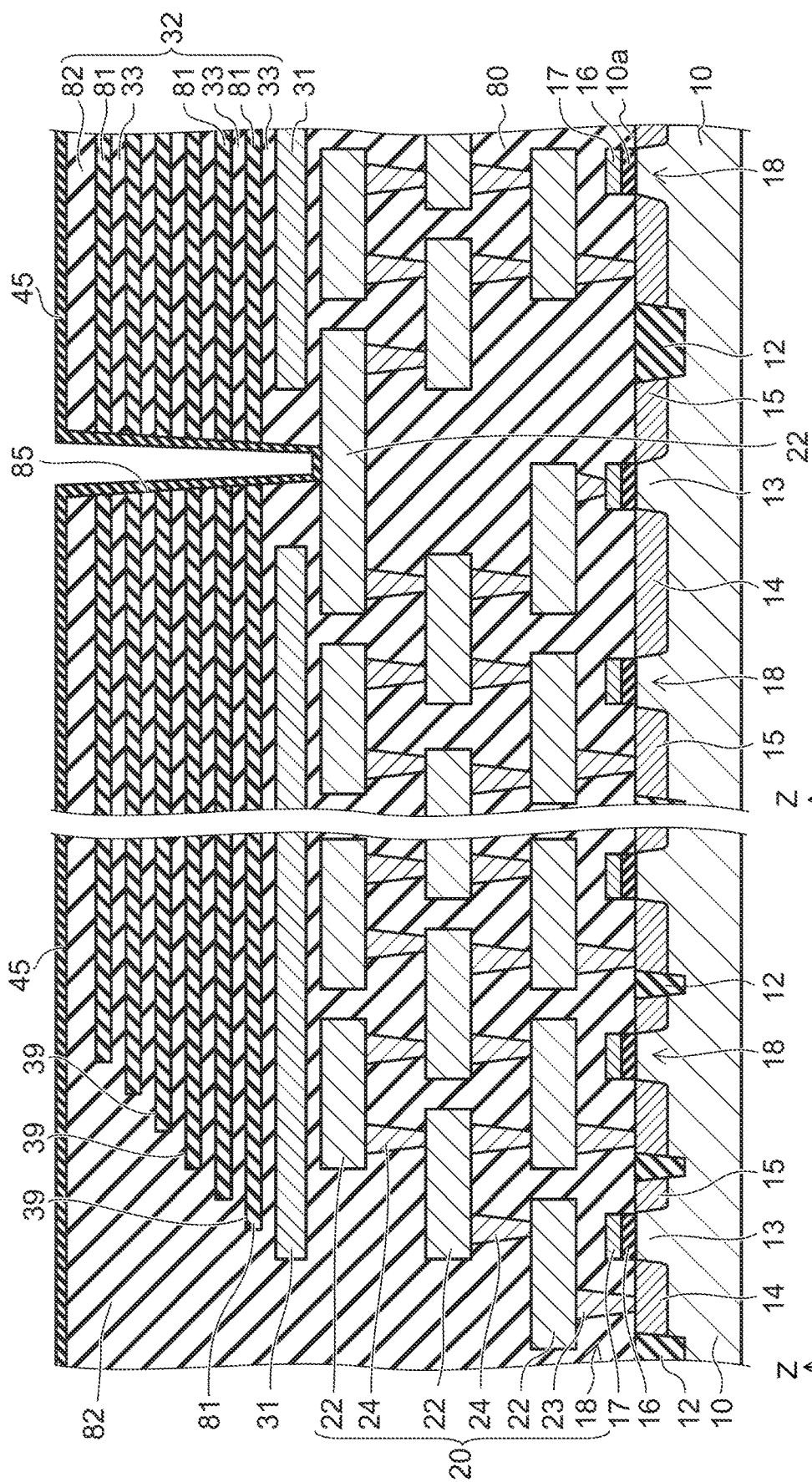
FIGS. 7A and 7B are cross-sectional views showing the method for manufacturing the semiconductor memory device according to the first embodiment.

Continuing as shown in FIGS. 7A and 7B, a via hole 85 is formed to pierce the inter-layer insulating film 82 and the stacked body 32, pass between the portions of the buried source line 31, reach the interconnect 22 of the uppermost layer of the integrated circuit 20, and divide the insulating member 37 (referring to FIG. 6B) in the Y-direction. Then, the insulating film 45 is formed by depositing silicon oxide on the entire surface. The insulating film 45 is formed also on the inner surface of the via hole 85.

Figures 8A, 8B:
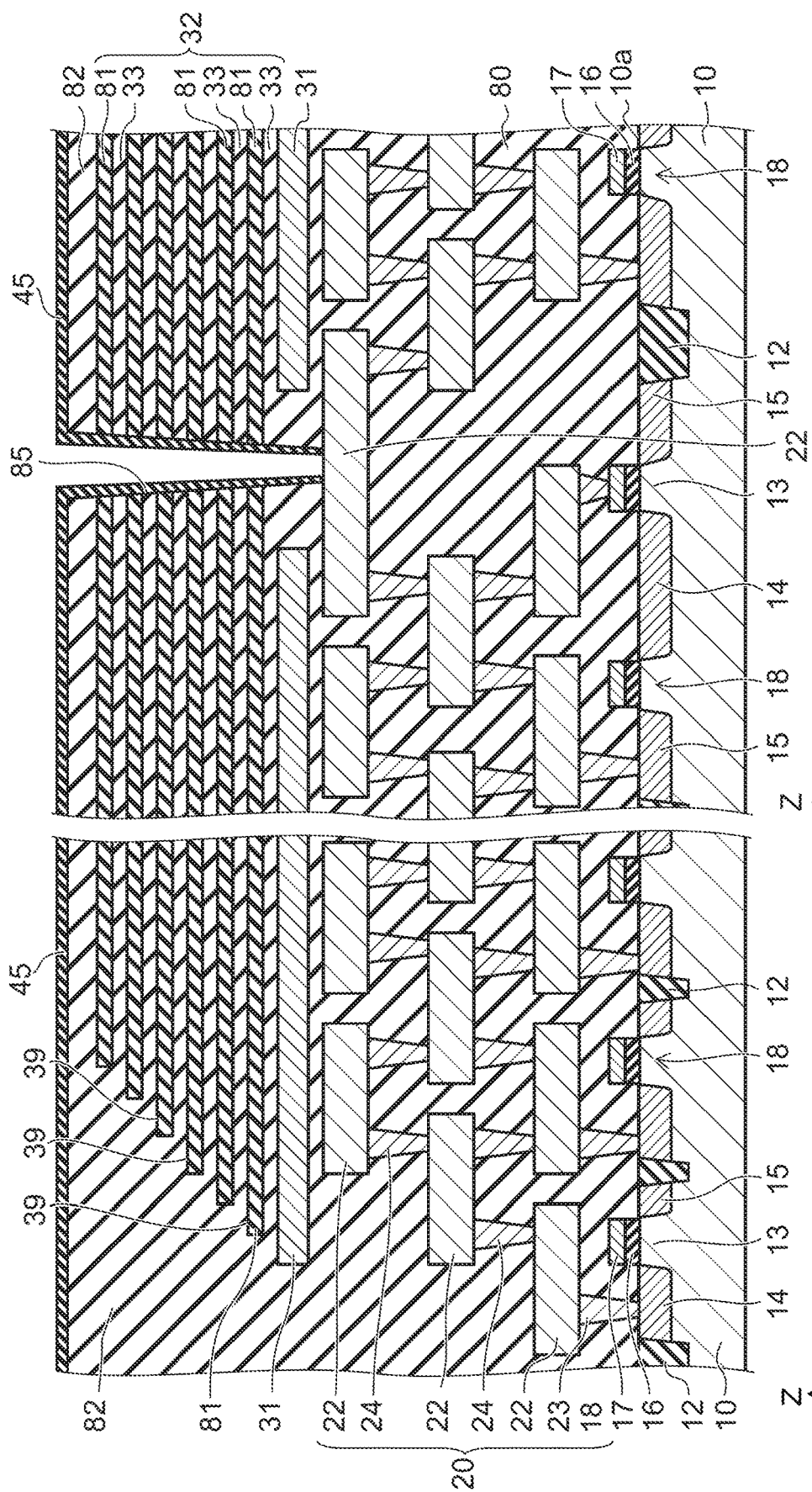
FIGS. 8A and 8B are cross-sectional views showing the method for manufacturing the semiconductor memory device according to the first embodiment.

Then, as shown in FIGS. 8A and 8B, the portion of the insulating film 45 formed on the bottom surface of the via hole 85 is removed by etching such as RIE (Reactive Ion Etching), etc. Thereby, the interconnect 22 is exposed at the bottom surface of the via hole 85.

Figures 9A, 9B:
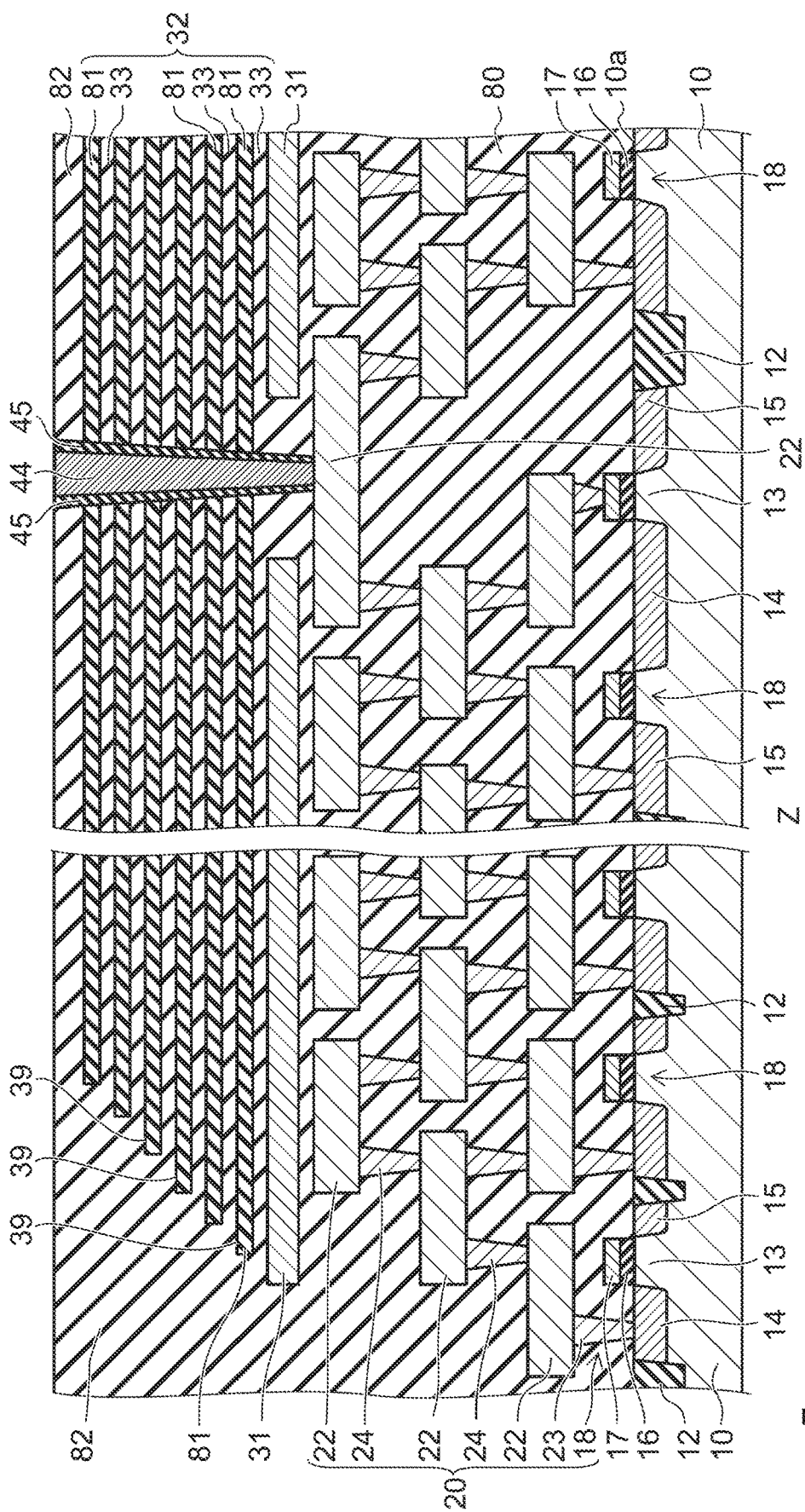
FIGS. 9A and 9B are cross-sectional views showing the method for manufacturing the semiconductor memory device according to the first embodiment.

Continuing as shown in FIGS. 9A and 9B, a barrier metal layer (not illustrated) is formed on the inner surface of the via hole 85 by depositing, for example, titanium nitride; and a main portion (not illustrated) is filled into the via hole 85 by depositing, for example, tungsten. Then, the tungsten and the titanium nitride that are formed on the inter-layer insulating film 82 are removed by performing planarization such as CMP (Chemical Mechanical Polishing), etc. Thereby, the through-via 44 is formed inside the via hole 85.

Figures 10A, 10B:
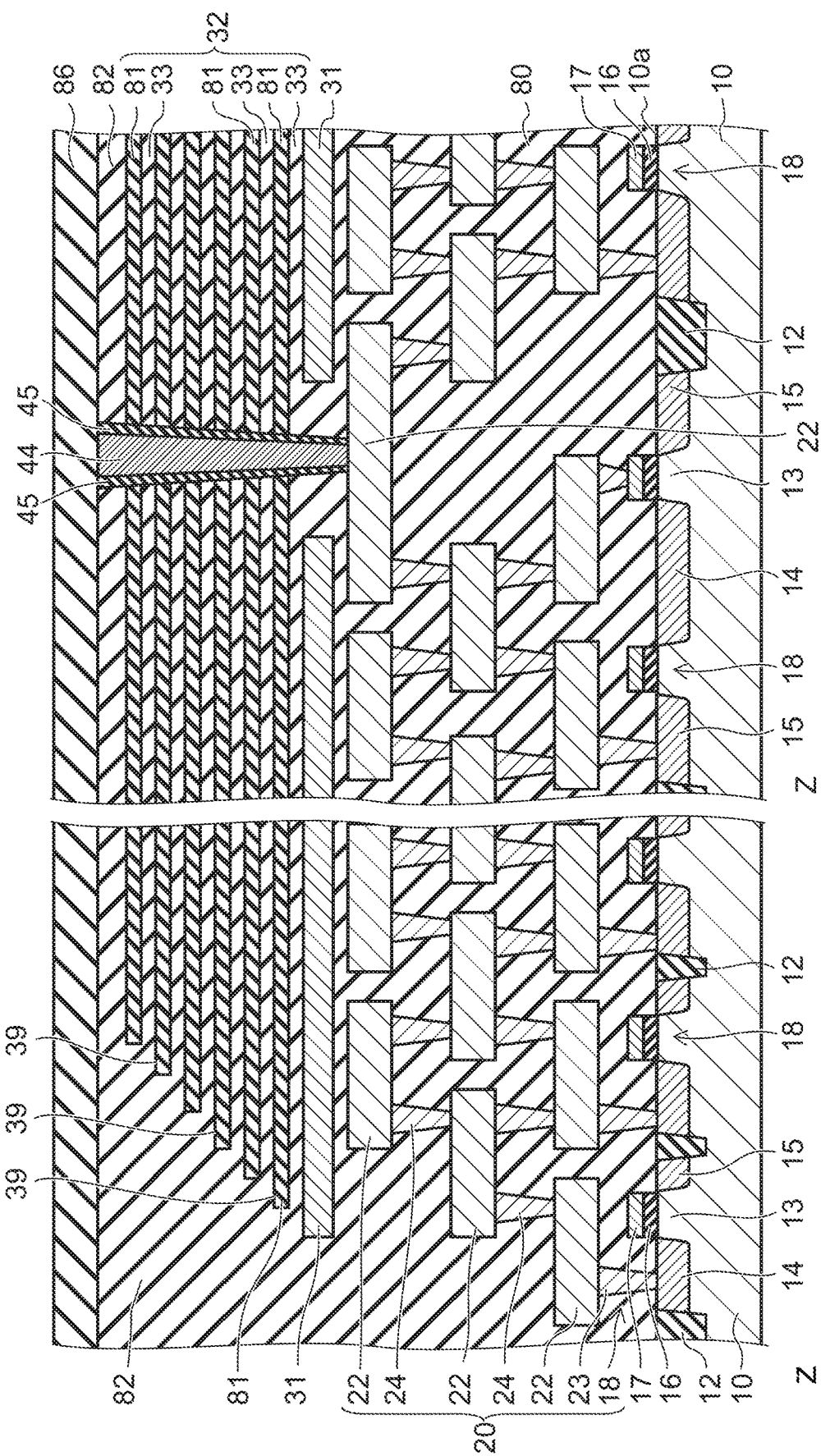
FIGS. 10A and 10B are cross-sectional views showing the method for manufacturing the semiconductor memory device according to the first embodiment.

Then, as shown in FIGS. 10A and 10B, an inter-layer insulating film 86 for adjusting the height of the memory holes MH (referring to FIG. 4) is formed on the inter-layer insulating film 82.

Continuing as shown in FIG. 4, the memory hole MH that extends in the Z-direction is formed to pierce the inter-layer insulating films 86, 82, and 80 and the stacked body 32 (referring to FIGS. 10A and 10B). Then, the low dielectric constant layer 74 that is made of silicon oxide is formed by oxidizing the inner surface of the memory hole MH. Then, the charge storage film 73, the tunneling insulating film 72, the silicon pillar 41, and the core member 71 are formed in this order on the surface of the low dielectric constant layer 74 inside the memory hole MH.

Then, as shown in FIG. 1, FIG. 2, FIGS. 3A and 3B, and FIG. 4, slits ST that extend in the Y-direction are formed in the inter-layer insulating films 86, 82, and 80 (referring to FIGS. 10A and 10B) and the stacked body 32. Then, the sacrificial films 81 are removed by performing wet etching via the slits ST. Thereby, a space 87 is formed between the insulating films 33.

Continuing, the high dielectric constant layer 75 is formed on the inner surface of the space 87 by depositing aluminum oxide via the slits ST. The blocking insulating film 76 is formed of the low dielectric constant layer 74 and the high dielectric constant layer 75. Then, the barrier metal layer 34b is formed on the surface of the high dielectric constant layer 75 by depositing titanium nitride via the slits ST. Then, the main portion 34a is formed inside the space 87 by filling tungsten via the slits ST. The electrode film 34 is formed of the barrier metal layer 34b and the main portion 34a. Then, the insulating plate 36 is formed by filling silicon oxide into the slits ST.

Then, contacts (not illustrated) that pierce the inter-layer insulating films 86, 82, and 80 and reach the integrated circuit 20 are formed around the stacked body 32. The contacts may be formed simultaneously with the through-via 44. Then, the contacts 59 that reach the steps 39 of the stacked body 32 are formed in the real staircase region RSR. Then, an inter-layer insulating film is further formed on the inter-layer insulating film 86; and the plugs 51, the bit lines 52, the intermediate interconnect 54, the plug 55, the intermediate interconnect 56, the plug 57, etc., are formed. Then, the upper layer interconnect 61 is formed and connected to the through-via 44 via the plug 57, the intermediate interconnect 56, the plug 55, and the intermediate interconnect 54. The inter-layer insulating films 80, 82, and 86 are used to form a portion of the inter-layer insulating film 60. Thus, the semiconductor memory device 1 according to the embodiment is manufactured.

Effects of the embodiment will now be described.

In the semiconductor memory device 1 according to the embodiment, because the integrated circuit 20 is provided between the semiconductor substrate 10 and the stacked body 32, the surface area of the peripheral circuit region RC can be reduced; and the chip surface area of the semiconductor memory device 1 can be reduced. As a result, the integration of the memory cells improves. Also, because the through-via 44 that pierces the stacked body 32 is provided, the power supply potential or the signal potential can be supplied from above the stacked body 32 to the integrated circuit 20 provided directly under the stacked body 32. In such a case, by using the through-via 44 in combination with the contacts provided around the stacked body 32 described above, it is easy to supply the power supply potential or the signal potential to any position of the integrated circuit 20; and the degrees of freedom of the layout of the integrated circuit 20 increase. The through-via 44 may be formed also in the dummy staircase region RSD in addition to the pillar placement region RP. Thereby, the degrees of freedom of the layout of the integrated circuit 20 increase even further.

In the case where the integrated circuit 20 is provided below the stacked body 32, although it is favorable to use a material having high heat resistance such as tungsten, etc., as the interconnect material, materials that have high heat resistance generally have high electrical resistivities. Therefore, if it is attempted to provide the contacts only around the stacked body 32 and to supply the power supply potential, etc., from the upper layer interconnect, the distance from the contacts to the central portion of the integrated circuit 20 lengthens; and the operations of the integrated circuit 20 are undesirably slow. In the embodiment, because the through-via 44 is provided to pierce the stacked body 32, the prescribed potential can be directly supplied to the central portion of the integrated circuit 20 via the through-via 44; and the operation speed of the integrated circuit 20 can be increased.

In the embodiment, the through-via 44 is formed not to divide the electrode films 34. Thereby, a configuration for connecting the divided electrode films 34 to each other is unnecessary; and the integration of the memory cells improves. This effect also is described in a comparative example described below.

In the embodiment, the through-via 44 is disposed at a position dividing the insulating member 37. The insulating members 37 are for dividing the upper selection gate line SGD; and the regions directly under the insulating members 37 originally were dead space where the memory cells are not formed. Therefore, by forming the through-via 44 to be interposed between the insulating members 37, the dead space can be utilized effectively; and the decrease of the integration of the memory cells due to the through-via 44 being provided can be suppressed.

In the embodiment, the insulating film 45 is provided on the side surface of the through-via 44. Thereby, the through-via 44 can be insulated reliably from the electrode films 34 using a small surface area. Thereby, the integration of the memory cells can be increased.

In the embodiment, in the processes shown in FIGS. 7A and 7B, the via hole 85 is formed by etching the insulating films 33 made of silicon oxide and the sacrificial films 81 made of silicon nitride. Then, subsequently, the sacrificial films 81 are replaced with the electrode films 34. Therefore, the etching is easy compared to the case where the via hole 85 is formed after the electrode films 34 made of a metal material such as tungsten or the like are formed.

In the embodiment, the through-via 44 does not divide the sacrificial films 81 and is formed not to be interposed in the formation regions of the slits ST as well. Therefore, the through-via 44 does not obstruct the removal of the sacrificial films 81 via the slits ST and does not obstruct the filling of the electrode films 34 after the sacrificial films 81 are removed.

In the embodiment, the memory holes MH and the silicon pillars 41 are formed in the through-via region RV as welt. Thereby, when the sacrificial films 81 are removed via the slits ST, similarly to the memory cell region RMC, the silicon pillars 41 are used as posts even in the through-via region RV; and sagging of the insulating film 33 can be suppressed.

Although an example is shown in the embodiment in which the through-via 44 is formed to divide the insulating member 37, this is not limited thereto; and if the through-via 44 is formed not to divide the electrode films 34, the through-via 44 may be disposed at a position separated from the insulating member 37. Although an example is shown in the embodiment in which the row decoder RD is provided on one Y-direction side of the memory array region RA, the row decoder RD may be provided on the two Y-direction sides. In such a case, contacts may be provided in the dummy staircase region RSD as well; and each of the electrode films 34 may be connected to either one of the row decoders RD provided on the two Y-direction sides.

A comparative example will now be described.

Figure 11:
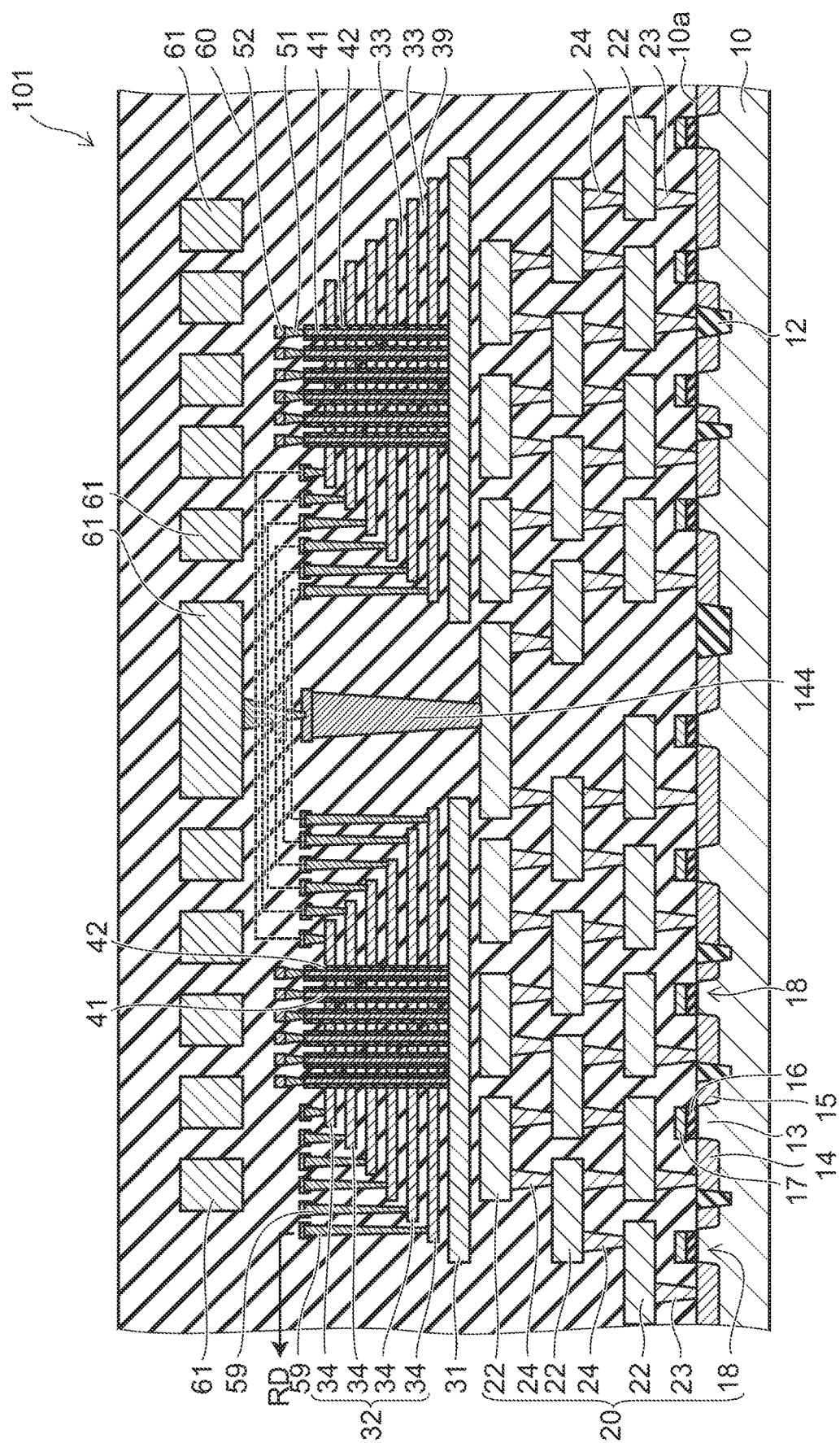
FIG. 11 is a cross-sectional view showing a semiconductor memory device according to a comparative example.

FIG. 11 is a cross-sectional view showing a semiconductor memory device according to the comparative example.

In the semiconductor memory device 101 according to the comparative example as shown in FIG. 11, a stacked body in which the insulating film 33 and the electrode film 34 are stacked alternately is formed; and subsequently, a conductive member 144 for connecting the upper layer interconnect 61 to the interconnect 22 of the integrated circuit 20 is formed. In such a case, because it is difficult to simultaneously etch the insulating films 33 made of silicon oxide and the electrode films 34 made of a metal material, the conductive member 144 is formed after dividing the electrode films 34 and burying the electrode films 34 with silicon oxide. Accordingly, the electrode films 34 are undesirably divided in the Y-direction.

However, because the row decoder RD is provided on only one Y-direction side of the stacked body 32, it is necessary to connect the divided portions of the electrode film 34 to each other via upper interconnects to connect the entire electrode film 34 to the row decoder RD. To draw out the multiple electrode films 34 stacked in the Z-direction to the upper interconnects, it is necessary to pattern the stacked body 32 into a staircase configuration; and the surface area for the staircase configuration becomes necessary. As a result, in the semiconductor memory device 101, there are more regions where the memory cells are not formed; and the integration is low.

Conversely, in the embodiment, because the electrode films 34 are not divided by the through-via 44, the upper interconnects that connect the divided portions of the electrode films 34 to each other are unnecessary; and it is unnecessary to pattern the stacked body 32 into a staircase configuration to draw out the electrode films 34 to the upper interconnects. Therefore, the chip surface area is small; and the integration is high.

Second Embodiment

A second embodiment will now be described.

Figure 12:
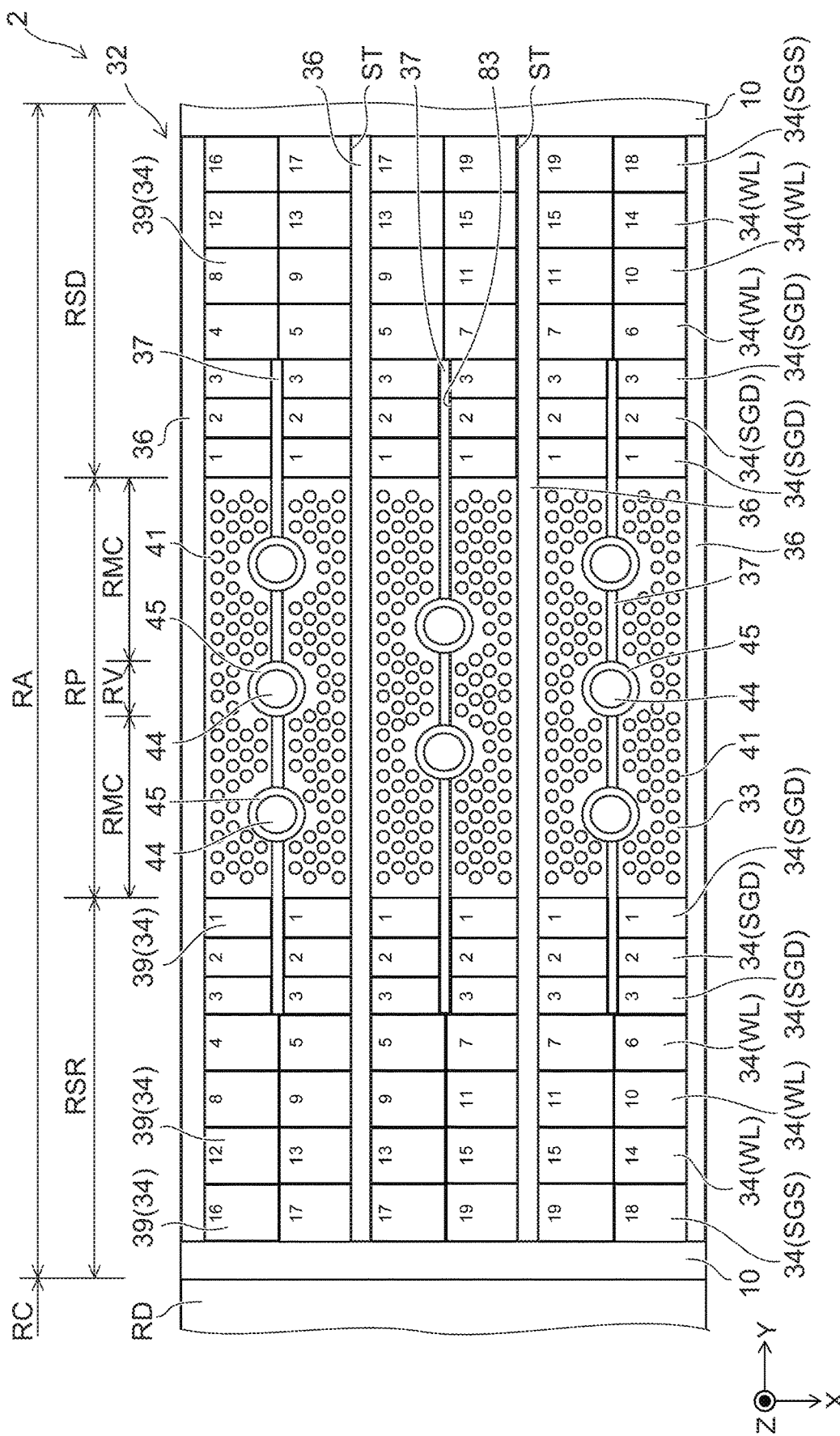
FIG. 12 is a plan view showing a semiconductor memory device according to a second embodiment.

FIG. 12 is a plan view showing a semiconductor memory device according to the embodiment.

In the semiconductor memory device 2 according to the embodiment as shown in FIG. 12, the multiple through-vias 44 are provided along each of the insulating members 37. For each of the insulating members 37, for example, the multiple through-vias 44 are arranged periodically. When viewed from the Z-direction as shown in FIG. 12, for example, the through-vias 44 may be arranged in a staggered configuration. The insulating film 45 is provided around each of the through-vias 44. The through-vias 44 may be disposed at the vicinity of a shunt interconnect (not illustrated), and may be disposed in regions between the pillar placement region RP and the real staircase region RSR or between the pillar placement region RP and the dummy staircase region RSD. Although the arrangement of the through-vias 44 is not limited to the example described above, it is favorable for the arrangement to be optimized inside the pillar placement region RP. Otherwise, the configuration, the manufacturing method, and the effects of the embodiment are similar to those of the first embodiment described above.

According to the embodiments described above, a semiconductor memory device having high integration can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device, comprising:
   a substrate;
   a peripheral circuit on the substrate;
   a first wiring provided above the peripheral circuit;
   a first semiconductor member extending in a first direction perpendicular to a surface of the substrate, the first wiring being provided between the first semiconductor member and the peripheral circuit in the first direction and electrically connected to the first semiconductor member;
   a second semiconductor member extending in the first direction, the first wiring being provided between the second semiconductor member and the peripheral circuit in the first direction and electrically connected to the second semiconductor member;
   a first conductive member extending in the first direction, the first conductive member being provided between the first semiconductor member and the second semiconductor member in a second direction perpendicular to the first direction and electrically connected to the peripheral circuit;
   a second conductive member extending in the first direction, the second conductive member being provided between the first semiconductor member and the second semiconductor member in the second direction and electrically connected to the peripheral circuit;
   a plurality of conductive layers arranged to be separated from each other along the first direction above the first wiring, the plurality of conductive layers including a first conductive layer;
   a first insulating member provided between the first conductive member and the first conductive layer and surrounding the first conductive member; and
   a second insulating member provided between the second conductive member and the first conductive layer and surrounding the second conductive member.

2. The semiconductor memory device according to claim 1, wherein
   a part of the first conductive layer is provided between the first insulating member and the second insulating member in the second direction.

3. The semiconductor memory device according to claim 1, further comprising:
   a third semiconductor member extending in the first direction, the first wiring being provided between the third semiconductor member and the peripheral circuit in the first direction and electrically connected to the third semiconductor member; and
   a fourth semiconductor member extending in the first direction, the first wiring being provided between the fourth semiconductor member and the peripheral circuit in the first direction and electrically connected to the fourth semiconductor member, the first conductive member being provided between the third semiconductor member and the fourth semiconductor member in a third direction perpendicular to the first direction and the second direction.

4. The semiconductor memory device according to claim 1, wherein
   the first conductive member includes a main portion of a metal.

5. The semiconductor memory device according to claim 1, wherein
   the first wring includes a first layer and a second layer provided on the first layer, the first layer including a metal material, the second layer including a silicon material and being connected to the first semiconductor member and the second semiconductor member.

6. The semiconductor memory device according to claim 1, wherein
   the peripheral circuit includes a first interconnect, the first interconnect being provided between the substrate and the first wiring in the first direction and directly connected to the first conductive member.

7. The semiconductor memory device according to claim 1, further comprising:
   a first charge storage member provided between the first semiconductor member and the first conductive layer.

8. The semiconductor memory device according to claim 4, wherein
   the first conductive member includes a barrier metal between the main portion and the first insulating member.

9. The semiconductor memory device according to claim 8, wherein
   the metal is tungsten and the barrier metal is titanium nitride.

10. The semiconductor memory device according to claim 6, wherein
    the peripheral circuit includes a second interconnect and a first via, the second interconnect being provided between the substrate and the first interconnect in the first direction, the first via being directly connected to the first interconnect and the second interconnect.

11. The semiconductor memory device according to claim 10, wherein
    the peripheral circuit includes a third interconnect and a second via, the third interconnect being provided between the substrate and the second interconnect in the first direction, the second via being directly connected to the second interconnect and the third interconnect.

12. The semiconductor memory device according to claim 11, wherein
    the peripheral circuit includes a third via and a transistor, the third via being directly connected to the third interconnect and the transistor.

13. A semiconductor memory device, comprising:
a substrate;
a peripheral circuit on the substrate;
a first wiring provided above the first interconnect;
a first semiconductor member extending in a first direction perpendicular to a surface of the substrate, the first wiring being provided between the first semiconductor member in the first direction and the peripheral circuit and electrically connected to the first semiconductor member;
a second semiconductor member extending in the first direction, the first wiring being provided between the second semiconductor member and the peripheral circuit in the first direction and electrically connected to the second semiconductor member;
a first conductive layer and a second conductive layer arranged in the first direction above the first wiring;
a first insulating member penetrating the first conductive layer and the second conductive layer in the first direction, the first insulating member being provided between the first semiconductor member and the second semiconductor member in a second direction perpendicular to the first direction;
a first conductive member extending in the first direction and being surrounded by the first insulating member;
a second insulating member penetrating the first conductive layer and the second conductive layer in the first direction, the second insulating member being provided between the first semiconductor member and the second semiconductor member in the second direction; and
a second conductive member extending in the first direction and being surrounded by the second insulating member.

14. The semiconductor memory device according to claim 13, wherein
a part of the first conductive layer is provided between the first insulating member and the second insulating member in the second direction.

15. The semiconductor memory device according to claim 13, further comprising:
a third semiconductor member extending in the first direction, the first wiring being provided between the third semiconductor member and the peripheral circuit in the first direction and electrically connected to the third semiconductor member; and
a fourth semiconductor member extending in the first direction, the first wiring being provided between the fourth semiconductor member and the peripheral circuit in the first direction and electrically connected to the fourth semiconductor member, the first conductive member being provided between the third semiconductor member and the fourth semiconductor member in a third direction perpendicular to the first direction and the second direction.

16. The semiconductor memory device according to claim 13, wherein
the first conductive member includes a main portion of a metal.

17. The semiconductor memory device according to claim 13, wherein
the first wring include a first layer and a second layer provided on the first layer, the first layer including a metal material, the second layer including a silicon material and being connected to the first semiconductor member and the second semiconductor member.

18. The semiconductor memory device according to claim 13, wherein
the peripheral circuit includes a first interconnect, the first interconnect being provided between the substrate and the first wiring in the first direction and directly connected to the first conductive member.

19. The semiconductor memory device according to claim 13, further comprising:
a first charge storage member provided between the first semiconductor member and the first conductive layer.

20. The semiconductor memory device according to claim 16, wherein
the first conductive member includes a barrier metal between the main portion and the first insulating member.

21. The semiconductor memory device according to claim 20, wherein
the metal is tungsten and the barrier metal is titanium nitride.

22. The semiconductor memory device according to claim 18, wherein
the peripheral circuit includes a second interconnect and a first via, the second interconnect being provided between the substrate and the first interconnect in the first direction, the first via being directly connected to the first interconnect and the second interconnect.

23. The semiconductor memory device according to claim 22, wherein
the peripheral circuit includes a third interconnect and a second via, the third interconnect being provided between the substrate and the second interconnect in the first direction, the second via being directly connected to the second interconnect and the third interconnect.

24. The semiconductor memory device according to claim 23, wherein
the peripheral circuit includes a third via and a transistor, the third via being directly connected to the third interconnect and the transistor.

* * * * *